(12) United States Patent
Hirata et al.

(10) Patent No.: US 8,179,173 B2
(45) Date of Patent: May 15, 2012

(54) DIGITALLY CALIBRATED HIGH SPEED CLOCK DISTRIBUTION

(75) Inventors: Erick M. Hirata, Torrance, CA (US); Lloyd F. Linder, Agoura Hills, CA (US)

(73) Assignee: Raytheon Company, Waltham, MA (US)

( * ) Notice: Subject to any disclaimer, the term of this patent is extended or adjusted under 35 U.S.C. 154(b) by 181 days.

(21) Appl. No.: 12/723,285

(22) Filed: Mar. 12, 2010

(65) Prior Publication Data

US 2011/0221486 A1    Sep. 15, 2011

(51) Int. Cl.
*H03L 7/00* (2006.01)
*H03H 11/16* (2006.01)

(52) U.S. Cl. ........ 327/146; 327/144; 327/150; 327/233; 327/234; 327/236; 327/237; 327/244; 327/245; 327/258

(58) Field of Classification Search .................. 327/144, 327/146–148, 150, 155–157, 159, 162, 163, 327/231, 233–237, 239, 243–247, 258, 259
See application file for complete search history.

(56) References Cited

U.S. PATENT DOCUMENTS 5,184,027 A * 2/1993 Masuda et al. ................. 327/149
5,550,515 A * 8/1996 Liang et al. ..................... 331/11
7,492,850 B2 * 2/2009 Menolfi et al. ................. 375/376
7,994,822 B2 * 8/2011 Otsuga et al. .................... 326/93
2010/0117697 A1 * 5/2010 Kanno et al. .................... 327/158

OTHER PUBLICATIONS

Morton, S.L., et al.; "High Resolution 20 GHZ Wideband Delay Generator"; Electronic Letters; Sep. 30, 2004; vol. 40; No. 20; 2pp.
Schmidt, Lothar, et al.; "Continuously Variable Gigahertz Phase-Shifter IC Covering More Than One Frequency Decade"; IEEE Journal of Solid-State Circuits; vol. 27; No. 6; Jun. 1992; 9pp.

* cited by examiner

*Primary Examiner* — Patrick O'Neill
(74) *Attorney, Agent, or Firm* — Christie, Parker & Hale, LLP

(57) ABSTRACT

An electronic circuit for distributing a clock signal to several clock destinations includes phase adjustment circuits for adjusting phase shifts of the clock at the respective one of the clock destinations responsive to a respective DC voltage feedback signal receive from the respective one of the clock destinations; phase detectors for detecting a phase shift of the clock signal at the respective one of the clock destinations according to a nearest neighbor clock destination; loop filters for generating and transmitting respective DC voltage feedback signals; current sources, each configured to receive the respective DC voltage feedback signal and output a respective current to a respective one of the phase adjustment circuits according to said respective DC voltage feedback signals to adjust the phase shift of the clock signal for the respective one of the clock destinations.

16 Claims, 4 Drawing Sheets

DIGITALLY CALIBRATED HIGH SPEED CLOCK DISTRIBUTION

FIELD OF THE INVENTION

The present invention relates generally to electronic circuits and more specifically to a digitally calibrated clock distribution circuit.

BACKGROUND

With ever increasing speed and complexity of electronic circuits, it is desirable that the noise, specifically the phase noise performance of clock signals for these electronic circuits does not degrade. Hence, the degradation of the phase alignment due to aging, temperature, mechanical stress, and other factors need to be addressed and remedied. This issue is typically addressed through complicated calibration processes, which although may provide initial calibration, they do not dynamically compensate for drift, aging, etc. Rather, the present methods periodically and manually perform the re-calibration.

More particularly, conventional clock distribution circuits manually adjust delay elements as part of the calibration or re-calibration. These circuits are typically open loop and thus are susceptible to temperature, mechanical stress, and aging that cause the circuit to lose calibration. Also, the existing schemes are not integrated. Moreover, the ability to integrate a large number of timing adjustments on the same integrated circuit (IC) provides additional reduction of skew.

For example, antenna arrays are becoming increasingly larger over time. The number of elements in the future antenna arrays will most likely be in the thousands. These arrays will require the distribution of high frequency, low phase noise clocks to receiver/exciter electronics, with the ability to adjust for phase delays between clock signals as a result of the difference in distance for the individual clocks to the individual receiver/exciter elements in the array. This must be done without degrading the phase noise and thermal noise floor of the reference clock signal (i.e., without adding any additional jitter to the clock signal). Additionally, it is important to be able to dynamically adjust for clock signal drift due to aging, temperature, mechanical stress, and other factors without the need for periodic re-calibration.

Therefore, there is a need for a digitally controlled clock distribution architecture or circuit, which can be used for the large scale, affordable sub-picosecond synchronization of distributed processors, radios, antenna arrays, data samplers, and the like operating at tens of Giga Hertz (GHz) clock frequencies to hundreds or thousands of nodes (clock loads).

SUMMARY OF THE INVENTION

In some embodiments, the present invention is an electronic circuit for distributing a clock signal to a plurality of clock destinations includes phase adjustment circuits, each corresponding to a respective one of the plurality of clock destinations for adjusting phase shifts of the clock at the respective one of the clock destinations responsive to a respective DC voltage feedback signal receive from the respective one of the clock destinations; phase detectors, each at the respective one of the clock destinations for detecting a phase shift of the clock signal at the respective one of the clock destinations according to a nearest neighbor clock destination; and loop filters, each at the respective one of the clock destinations and each corresponding to a respective one of the plurality of phase detectors for generating and transmitting said respective DC voltage feedback signals, each corresponding to a phase shift in the clock signal at the respective one of the clock destinations, detected by the respective one of the phase detectors.

The circuit further includes current sources, each configured to receive the respective DC voltage feedback signal and output a respective current to a respective one of the phase adjustment circuits according to said respective DC voltage feedback signals. Each phase adjustment circuit comprises a pair of push-pull digital-to-analog converters (DACs) programmable to adjust the phase shift of the clock signal for the respective one of the clock destinations.

In some embodiments, the present invention is method for distributing a clock signal to a plurality of clock destinations. The method includes: transmitting the clock signal from a source to the plurality of clock destinations; dynamically detecting a phase shift at each of the clock destinations by comparing a clock signal received at a respective destination to a clock signal received at a nearest neighbor of the respective destination; generating a DC voltage feedback signal at each of the clock destinations, each DC voltage feedback signal corresponding to a respective detected phase shift; transmitting the DC voltage feedback signals to the source; and dynamically adjusting the phase shift of the clock signal in a positive or a negative direction for a respective clock destination, responsive to a respective received DC voltage feedback signal.

DETAILED DESCRIPTION

In one embodiment, the present invention is a digitally calibrated clock distribution apparatus which can be used for the large scale, affordable sub-picosecond synchronization of distributed loads (elements) to thousands of nodes. The invention uses a pair of precision digital-to-analog converter (DAC) to set precision voltages to tune delays through a phase adjust circuit. As a result, the invention achieves a more precise clock adjustability within sub-picoseconds for multiple clock loads, for example, elements in an antenna array. Once the phase is calibrated, with use of a feedback loop, any phase shifts over time that comes with aging, temperature, mechanical stress or any other factors are automatically adjusted to keep the timing aligned.

According to the present invention, one of the clock signals at the destination is used as a reference to determine the clock phase shift. In some embodiments, a nearest neighbor clock signal at the destination is used as the reference. This way, relative phase shift of one clock signal is determined at the destination.

The circuit (apparatus) of the present invention self-corrects for variations due to aging, temperature, and mechanical stress. A feedback circuit provides the phase drift information to the phase adjust cell, which re-synchronizes the channels. Each channel is calibrated individually relative to the reference signal, including per/channel propagation delay compensation. Large number of distributed, low phase noise, clock paths may be implemented on the same integrated circuit (IC) as the digital delay adjustment circuitry.

Furthermore, in conjunction with the integrated circuit technology, the invention lends itself to high levels of integration. This allows for a large number of phase-adjusted clock signals to be integrated onto a single IC. The invention has the ability to handle a wide range of clock frequencies, over several orders of magnitude. The present invention is capable of generating and distributing clock signals at frequencies more than 20 GHz and enables sub-picosecond (ps) synchronization over distances with better than −90 dBc/Hz phase noise at a 100 kHz offset and picosecond skew correction for systems with up to thousands of channels.

Figure 1:
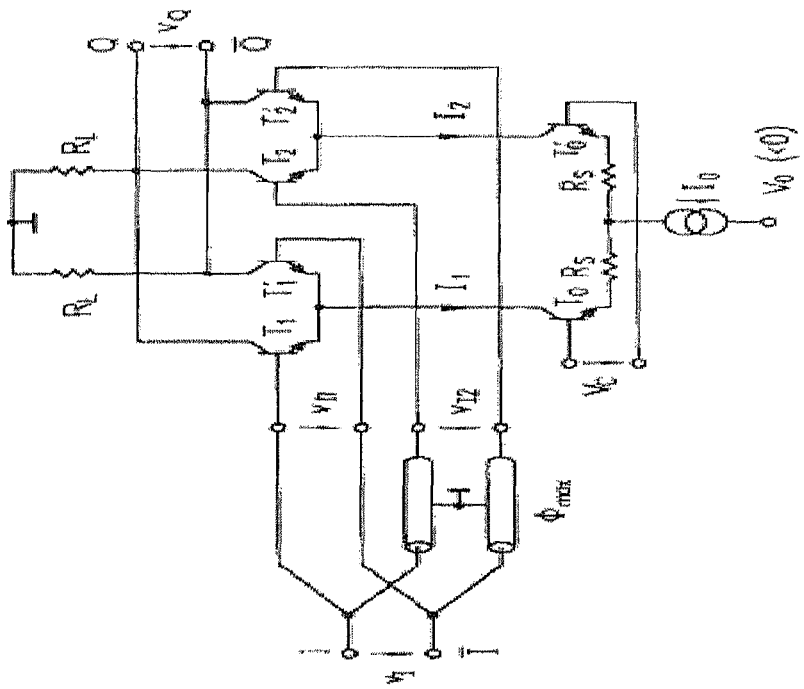
FIG. 1 is an exemplary circuit diagram for a typical phase shifter.

In some embodiments, the invention utilizes a phase shifter and a pair of precision DACs with both way trimming capability to provide a digitally based delay circuit. A typical (Gilbert) phase shifter is shown in FIG. 1. The phase shifter includes a Gilbert cell (multiplier) and can be simplistically thought of as a differential pair with input offsets. With no input offset at $V_C$, when the differential input $V_I$ is balanced, the differential output voltage $V_O$ switches. Thus, if the inputs are balanced at time t=0, then the output voltage $V_O$ is also balanced at time t=0. If, on the other hand, an offset voltage is added to one side of the differential pair by the control voltage $V_C$, the output will not be balanced until the differential input voltage overcomes the offset, in time. Therefore, the output will switch at time Δt instead of t=0. When the input voltages $V_C$ and $V_1$ are large compared to the threshold voltage $V_T$ of the transistors, all the six transistors $T_0$, $T'_0$, $T_1$, $T'_1$, $T_2$, and $T'_2$ behave as nonsaturating switches. Here, $V_C$ is a DC control voltage, which creates a control current through the transconductance of the bottom differential pair ($T_0$ and $T'_0$). The linear range of this differential pair can be inferred by the linearity of the transfer function in FIG. 2. This offset current produces a phase shift in the output signal at $V_O$.

By introducing a phase shift of $\Phi_{max}$ at the input, the phase shift at the output can be adjusted. That is, in order to create a 90 degree (quadrature phase shift), the clock frequency itself is used. In other words, similar to two RC networks, in which each RC network introduces a 45 degree phase shift at a particular frequency, this circuit generates a 90 degree phase at a particular frequency.

However, this approach has several problems. One problem is that, the circuit only works nominally at one frequency. Namely, the 90 degree phase shift, if implemented monolithically, does not work very well for a wide range of frequencies. The circuit is typically tuned for very narrow bandwidth operation and thus it can not accommodate a wide range of clock frequencies. A second problem with this approach is that, the performance of the circuit substantially varies over process and temperature. It also has limited frequency range, but is wider band than a simple RC network. Buffers can be used to create a time delay equivalent to 90 degrees, but the buffers suffer from process, voltage, and temperature sensitivity as well, and the time delay is only good for one frequency.

Figure 2:
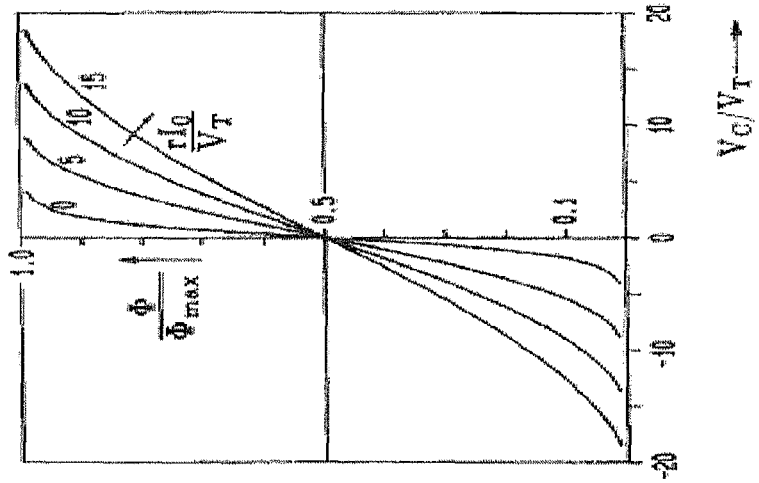
FIG. 2 is a graph depicting voltage variation of the phase shifter shown in FIG. 1.

FIG. 2 is a graph depicting voltage variation of the phase shifter shown in FIG. 1. As shown, the phase shift varies nonlinearly with the ratio of the threshold voltage $V_T$ over $V_c$. Once the 90 degree phase shift of the signal is generated, the phase delay of the output signal is described by the transfer function in FIG. 2. As shown, the phase delay varies from 0 degrees (all the current in the differential pair with no phase shift) to 90 degrees (all the current in the differential pair with 90 degrees phase shift). As $V_C$ changes from 0 Volts to the point where the bottom differential pair is flipped, the amount of input signal that defines the output signal changes from all in one differential pair (0 degrees) to all in the other differential pair (90 degrees).

The present invention digitally programs the offset voltage with fine resolution and dynamically provides a feedback loop for automatic phase adjustment. This enables the invention to adjust the offset voltage, subsequently adjusting the point in time where the output voltage is balanced.

Figure 3:
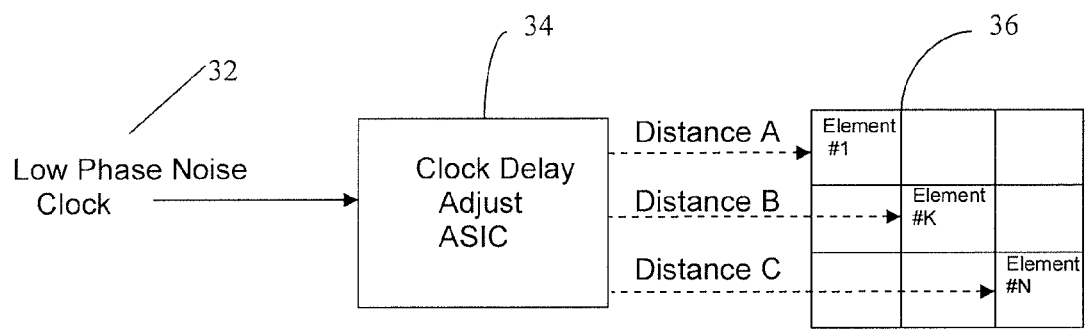
FIG. 3 is a conceptual antenna array system utilizing a clock delay adjust ASIC, according to some embodiments of the present invention.

FIG. 3 is a conceptual antenna array system utilizing a clock delay adjust application specific integrated circuit (ASIC), according to some embodiments of the present invention. The single, low phase noise clock 32 is distributed via non-uniform distances to Radio Frequency on Flexible Boards (RF-on-Flex) elements 1 to N in the antenna array 36. Each Receiver/Exciter (REX) element 1 to N requires a phase aligned clock signal. In some embodiment, the present invention is implemented in an ASIC 34, which results in a higher integration and lower cost.

Figure 4:
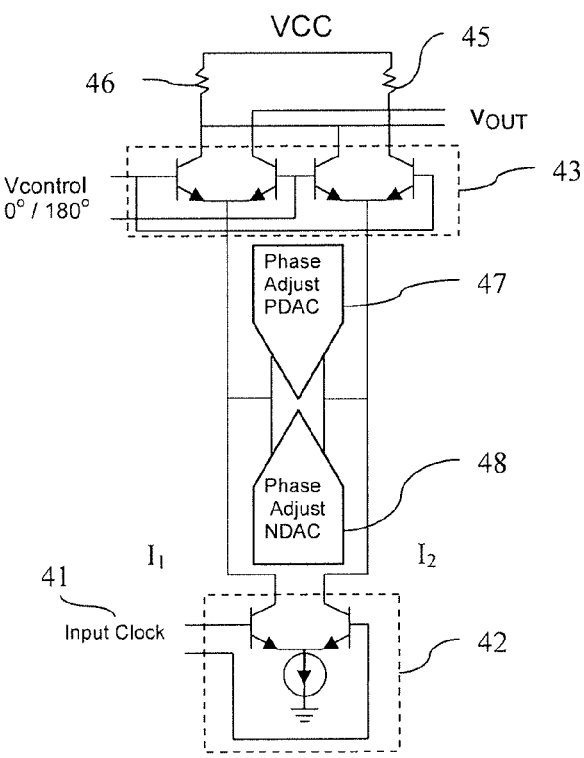
FIG. 4 depicts a circuit for adjusting the input clock delay, according to some embodiments of the present invention.

FIG. 4 depicts a circuit for adjusting the input clock delay, according to some embodiments of the present invention. As shown, the input clock 41 is received at the differential pair 42. The differential pair 42 then produces differential output currents $I_1$ and $I_2$. A push-pull current mode DAC pair 47 and 48 adds a DC offset current to the signal. A push-pull DAC (a NDAC and PDAC pair) has the ability to push current into the circuit or pull current out of the circuit. Here, the NDAC pulls current from the circuit and the PDAC pushes current into the circuit. In some embodiments, the NDAC is designed based on NMOS transistors, and the PDAC is designed based on PMOS transistors. The PDAC 47 and the NDAC 48 allow the ability (programming) to provide trimming of the zero crossing signal in both directions in time.

Referring back to FIG. 2, consider the point in the transfer function where there is 45 degrees of phase shift in the output signal (at $V_C$=0), in order to have more than a 45 degree shift, $V_C$ has to be positive. In order to have less than a 45 degree shift, $V_C$ has be negative. In the same manner, imagine that the point in time (the zero crossing) of the output signal is 0. The NDAC 48 creates a shift in the zero crossing to the right in time, therefore adding a positive phase shift to the output signal. Similarly, PDAC 47 creates a shift in time to the left and thus adds a negative phase shift to the output signal. This current results in an offset voltage at the load resistors 45 and 46, which in turn creates a differential offset at the next input differential pairs 43. This offset voltage adjusts the zero crossing voltage of the next stage differential pair, which is the receiver for the output of the signal of this stage. This adjusts the phase of the clock signal by introducing a voltage offset to the differential pair to change the point at which the differential is balanced. Thus, the point in time where the differential pair is balanced and the differential output is zero, is shifted in time.

A control signal, Vcontrol determines if the clock signal phase delay is adjusted by 0 or 180 degrees phase shift. That is, the top differential pair simply switches the phase of the output signal from 0 degrees to 180 degrees. What this does is to ease the requirements on the ranges of the DACs. The DACs only have to cover a 90 degree phase shift (0-90 or 90-180), as opposed to 0-180. As a result, one bit of resolution is gained on the phase trim by adding this differential pair. This allows the resolution needed to be only ½ the clock period and helps minimize the parasitic, capacitance at the emitter of the control differential pair, so that it does not band limit the signal. This circuit can be programmed to change the phase shift of the output signal by programming the desired offset into the NDAC/PDAC pair.

Each DAC has a least significant bit (LSB) current. This current introduces an offset at the output of the circuit. Accordingly, as a function of the control voltage generated by the LSB of the DAC, an analog voltage is produced. The time step is a function of the voltage step, and thus the LSB resolution of the DAC. The resolution of the DAC will be defined such that an analog voltage step translates to a time step of <0.25 ps. Depending on the parasitic capacitances of the DAC, as well as the thermal noise limits of the DAC, the resolution of the voltage step associated with the time step can be further reduced to below 0.25 ps.

Figure 5:
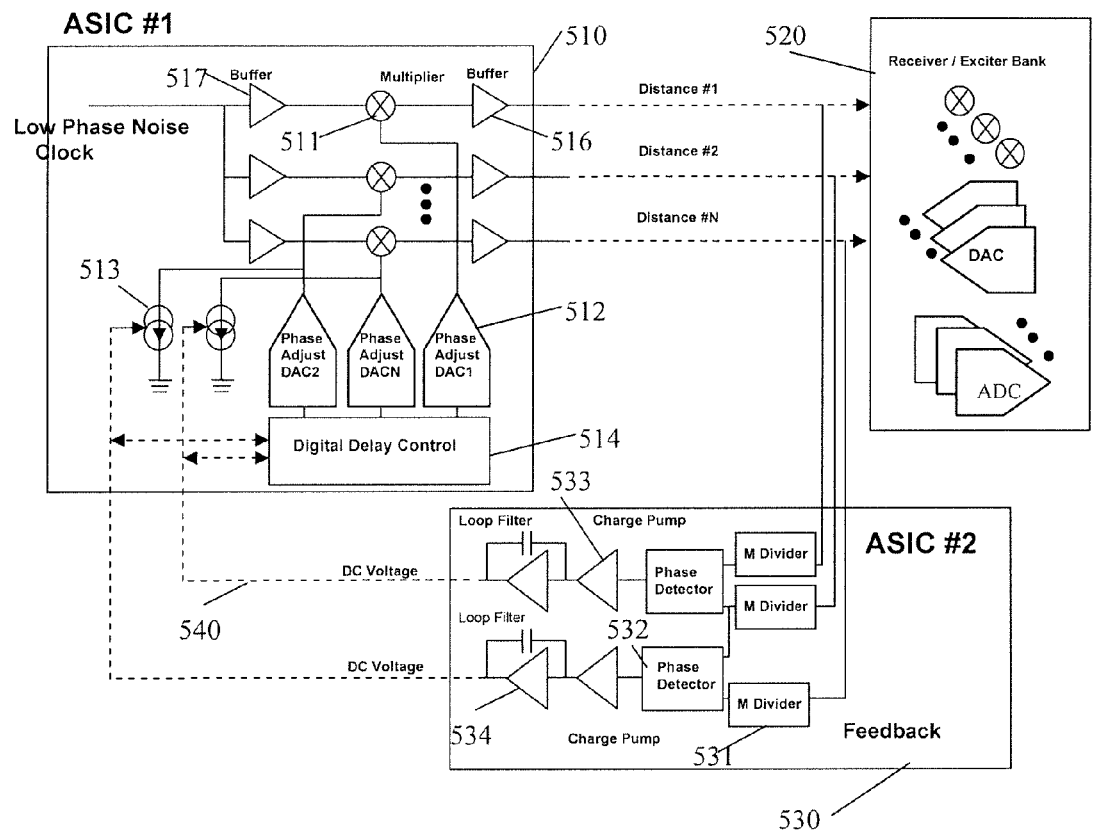
FIG. 5 is an exemplary block diagram for clock delay adjust circuits, according to some embodiments of the present invention.

FIG. 5 is an exemplary block diagram for clock delay adjust circuits, according to some embodiments of the present invention. A feedback loop 530 provides phase drift information to the multiplier 511 for re-synchronization. In some embodiments, a second ASIC 530 located at each element in the array implements the feedback loop 530. This is to allow for a feedback DC signal that keeps all of the clock signals aligned in time, over time. The feedback loop 530 includes optional dividers 531, phase detectors 532, charge pumps 533, and loop filters 534. The received clocks for two nearest neighbors in the clock loads 520 (for example, a REX element array) are optionally divided down locally to drive a phase detector 532. The dividers 531 are optional and are used only when the phase detectors 532 are slow relative to the clock frequency.

The outputs of the phase detectors 532 are pulses associated with delays in the clock signals for the two neighboring REX elements. That is, each phase detector 532 uses a nearest neighbor clock as a reference to detect the phase shift of a received clock at an element. These voltage pulses drive the charge pumps 533, which integrate these pulses onto the integrating capacitors C in the loop filters 534. The charge pumps 533 and the loop filters 534 then produce DC voltages 540 that are sent back to current sources 513 that are adjusted by the digital delay controls 514 in order to correct for any delays. In some embodiments, the DC voltages 540 are digitized and based on the digitized voltages, the NDAC and PDAC pair are adjusted. For example, the digitized voltages, through the digital control, can adjust the currents out of the PDAC and the NDAC to adjust the output offset voltage which adjusts the zero crossing of the next stage. In some embodiments, the DC voltages 540 are used to adjusts corresponding current sources. The DC voltages drive the base of a resistively degenerated current source. This voltage will increase or decrease the current in the current source, which will have the same effect on the output offset as the NDAC and PDAC. The process is performed for all elements of the entire array.

The buffers 517, the multipliers 511 and the phase adjust DACs 512 in the ASIC 510 can be construed as the phase shifter of FIG. 4. In some embodiments, each of the DC voltages from the feedback loop 530 drives a current source 513 in the multiplier cell 511. The two way current sources 513 can act in a similar manner to the PDAC and NDAC. If one of the current sources increases, while the other decreases, it is equivalent in functionality to the current increasing in the NDAC. For the opposite action (one decrease, the other increase), it is equivalent to the current increasing in the PDAC. The digital control 514 can work independently of the current sources 513 (if the feedback DC voltage drives real current sources), or it can work with a digitized version of the DC feedback voltage to control the PDAC and NDAC. Here, multiplier cell 511 is equivalent in functionality to the differential pair 43 in FIG. 4.

The multiplier cell 511 subsequently adjusts the clock phase delay to the proper value. Accordingly, the adjustment of the phase delay is accomplished through the feedback DC signal that adjusts the currents of the phase adjust DAC circuits 512 (or the current sources 513).

Figure 6:
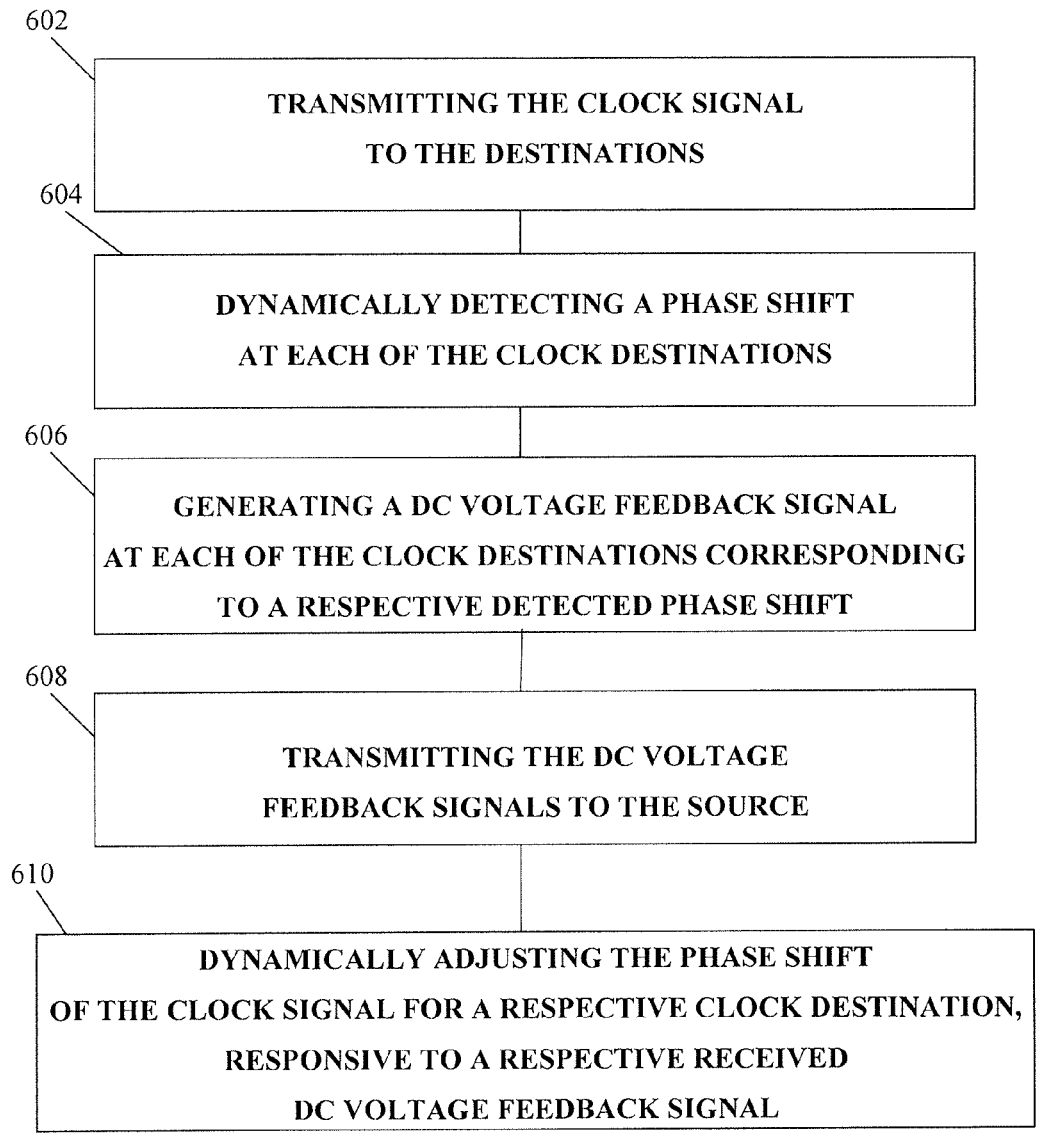
FIG. 6 is an exemplary process flow for distributing a clock signal to a plurality of clock destinations, according to some embodiments of the present invention.

FIG. 6 is an exemplary process flow for distributing a clock signal to a plurality of clock destinations, according to some embodiments of the present invention. In block 602, the clock signal is transmitted from a source to the plurality of clock destinations. A phase shift is dynamically detected at each of the clock destinations by comparing a clock signal received at a respective destination to a clock signal received at a nearest neighbor of the respective destination, in block 604. Here for destination N, the nearest neighbor is selected as destination #2. For example, clock signal #1 is the reference signal for clock signal #2, which is the nearest neighbor signal that is compared to clock signal #1. Likewise, clock signal #3 is compared to clock signal #2, etc. Clock signal #N, which is an element at the edge of the array, is compared to clock signal #(N−1) (its nearest neighbor). However, in some embodiments, the edge element (element N) is compared to clock signal #1 (the reference element).

This way, relative (rather than absolute) phase shift of one clock signal is determined at the destination. A DC voltage feedback signal is then generated at each of the clock destinations, in block 606. Each DC voltage feedback signal corresponds to a respective detected phase shift. The generated DC voltage feedback signals are then transmitted to the source, in block 608. the phase shift of the clock signal is dynamically adjusted in a positive and/or a negative direction for a respective clock destination, responsive to a respective received DC voltage feedback signal, in block 610. The ability to adjust the clock signal in a positive and/or a negative direction is provided by the pair of push-pull DACs and the two way directionality of the current sources 513. The phases can be initially adjusted or calibrated by programming each push-pull DAC.

The feedback loop adjusts for phase shifts over time due to aging, temperature, mechanical stress, or any other factors that cause the initial calibration to shift over time, alleviating the need for re-calibration of the digitally adjusted delay after the first calibration. This improves the accuracy of the adjusting the clock delay and reduces the expense involved in periodic re-calibrations. Without the feedback loop 530, any phase shifts during operation would require re-calibration.

The present invention can be extended to take into account timing skews between the loads (e.g., elements) to the feedback loop by applying the same timing adjustment circuit at the two neighboring elements that have finite, defined delay/skew to the feedback loop itself.

The present invention can be used for beam steering applications, which require sub-picosecond adjustments for 10-20 GHz clock signals. Furthermore, the present invention can be used for sensor arrays in systems applications. In the sensor arrays in systems application for airships, there is significant use of RF-on-Flex (REX) in order for the electronics to conform to the shape of the airship. The electronics associated with this application has thousands of REX nodes that require synchronized, distributed clocks. The clock distribution circuit of the present invention provides self-correction and self-healing for aging, temperature drift, time shifts due to mechanical stress, and any other factors that can cause phase shifts between clocks over time.

Moreover, the present invention may be used as a component of miniature GPS antenna array electronics in mini-array technology.

Additionally, the digitally programmable delay (phase) clocks of the present invention may be used for pin electronics for automatic test equipment (ATE), in which the clock has to be properly distributed to few thousands nodes.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims.

What is claimed is:

1. An electronic circuit for distributing a clock signal to a plurality of clock destinations comprising:
    a plurality of phase adjustment circuits, each corresponding to a respective one of the plurality of clock destinations for adjusting phase shifts of the clock at the respective one of the clock destinations responsive to a respective DC voltage feedback signal received from the respective one of the clock destinations;
    a plurality of phase detectors, each at the respective one of the clock destinations for detecting a phase shift of the clock signal at the respective one of the clock destinations according to a nearest neighbor clock destination;
    a plurality of loop filters, each at the respective one of the clock destinations and each corresponding to a respective one of the plurality of phase detectors for generating and transmitting said respective DC voltage feedback signals, each corresponding to a phase shift in the clock signal at the respective one of the clock destinations, detected by the respective one of the phase detectors; and
    a plurality of current sources, each configured to receive the respective DC voltage feedback signal and output a respective current to a respective one of the phase adjustment circuits according to said respective DC voltage feedback signals, wherein
    each phase adjustment circuit comprises a pair of push-pull digital-to-analog converters (DACs) programmable to adjust the phase shift of the clock signal for the respective one of the clock destinations.

2. The electronic circuit of claim 1, further comprising a charge pump at an output of each phase detector for increasing or decreasing the output of a respective phase detector.

3. The electronic circuit of claim 1, further comprising a divider at an input of each phase detector for decreasing a frequency of the clock signal at the input of a respective phase detector.

4. The electronic circuit of claim 1, wherein the plurality of clock destinations correspond to a plurality of antenna elements of an antenna array.

5. The electronic circuit of claim 1, wherein the plurality of clock destinations correspond to a plurality of pins of an automatic test equipment.

6. The electronic circuit of claim 1, wherein the plurality of clock destinations correspond to a plurality of RF-on-Flex nodes.

7. The electronic circuit of claim 1, wherein each phase adjustment circuit further comprises a Gilbert multiplier.

8. The electronic circuit of claim 1, wherein each phase detector and each loop filter are integrated in an integrated circuit (IC) chip at a respective clock destination.

9. A method for distributing a clock signal to a plurality of clock destinations, the method comprising:
    transmitting the clock signal from a source to the plurality of clock destinations;
    dynamically detecting a phase shift at each of the clock destinations by comparing a clock signal received at a respective destination to a clock signal received at a nearest neighbor of the respective destination;
    generating a DC voltage feedback signal at each of the clock destinations, each DC voltage feedback signal corresponding to a respective detected phase shift;
    transmitting the DC voltage feedback signals to the source;
    dynamically adjusting the phase shift of the clock signal in a positive or a negative direction for a respective clock destination, responsive to a respective received DC voltage feedback signal; and
    initially calibrating phase shifts of the clock signal for each clock destination by programming a pair of push-pull digital-to-analog converters (DACs) for each clock destination.

10. The method of claim 9, wherein the plurality of clock destinations correspond to a plurality of antenna elements of an antenna array.

11. The method of claim 9, wherein the plurality of clock destinations correspond to a plurality of pins of an automatic test equipment.

12. The method of claim 9, wherein the plurality of clock destinations correspond to a plurality of RF-on-Flex nodes.

13. An electronic circuit for distributing a clock signal to a plurality of clock destinations comprising:
    means for transmitting the clock signal from a source to the plurality of clock destinations;
    means for dynamically detecting a phase shift at each of the clock destinations by comparing a clock signal received at a respective destination to a clock signal received at a nearest neighbor of the respective destination;
    means for generating a DC voltage feedback signal at each of the clock destinations, each DC voltage feedback signal corresponding to a respective detected phase shift;
    means for transmitting the DC voltage feedback signals to the source;
    means for dynamically adjusting the phase shift of the clock signal in a positive or a negative direction for a respective clock destination, responsive to a respective received DC voltage feedback signal; and
    means for initially calibrating phase shifts of the clock signal for each clock destination by programming a pair of push-pull digital-to-analog converters (DACs) for each clock destination.

14. The electronic circuit of claim 13, wherein the plurality of clock destinations correspond to a plurality of antenna elements of an antenna array.

15. The electronic circuit of claim 13, wherein the plurality of clock destinations correspond to a plurality of pins of an automatic test equipment.

16. The electronic circuit of claim 13, wherein the plurality of clock destinations correspond to a plurality of RF-on-Flex nodes.

* * * * *